United States Patent
Dokai

(10) Patent No.: US 7,595,862 B2
(45) Date of Patent: Sep. 29, 2009

(54) EXPOSURE APPARATUS AND METHOD OF MANUFACTURING DEVICE

(75) Inventor: Koji Dokai, Utsunomiya (JP)

(73) Assignee: Canon Kabushiki Kaisha, Tokyo (JP)

(*) Notice: Subject to any disclaimer, the term of this patent is extended or adjusted under 35 U.S.C. 154(b) by 351 days.

(21) Appl. No.: 11/766,473

(22) Filed: Jun. 21, 2007

(65) Prior Publication Data
US 2008/0002175 A1    Jan. 3, 2008

(30) Foreign Application Priority Data
Jun. 30, 2006 (JP) .............................. 2006-181895

(51) Int. Cl.
G03B 27/74 (2006.01)
G03B 27/54 (2006.01)

(52) U.S. Cl. ......................... 355/68; 355/67

(58) Field of Classification Search .................. 355/67, 355/68
See application file for complete search history.

(56) References Cited

U.S. PATENT DOCUMENTS
2006/0170891 A1   8/2006   Nishinaga et al.
2006/0181690 A1   8/2006   Nishinaga et al.

FOREIGN PATENT DOCUMENTS
JP   2000-150334 A   5/2000
JP   2005-129914 A   5/2005
JP   2005-268744 A   9/2005

*Primary Examiner*—Peter B Kim
(74) *Attorney, Agent, or Firm*—Canon U.S.A., Inc. I.P. Division

(57) ABSTRACT

An exposure apparatus includes a light source; an illumination optical system that illuminates an original with the light; a substrate stage that holds and moves a substrate; a projection optical system that projects the light from the original, the projection optical system and the substrate having therebetween a first gap filled with liquid for exposure of the substrate; a first detector that detects a light quantity of light and passing along a light path of the illumination optical system; a second detector disposed on the substrate stage, to detect a light quantity of light transmitted through the illumination optical system and the projection optical system; and a calculator that determines a first conversion factor with respect to each of the plurality of exposure conditions used for conversion between a light quantity detected by the second detector with gas and a light quantity detected by the second detector with the liquid.

11 Claims, 6 Drawing Sheets

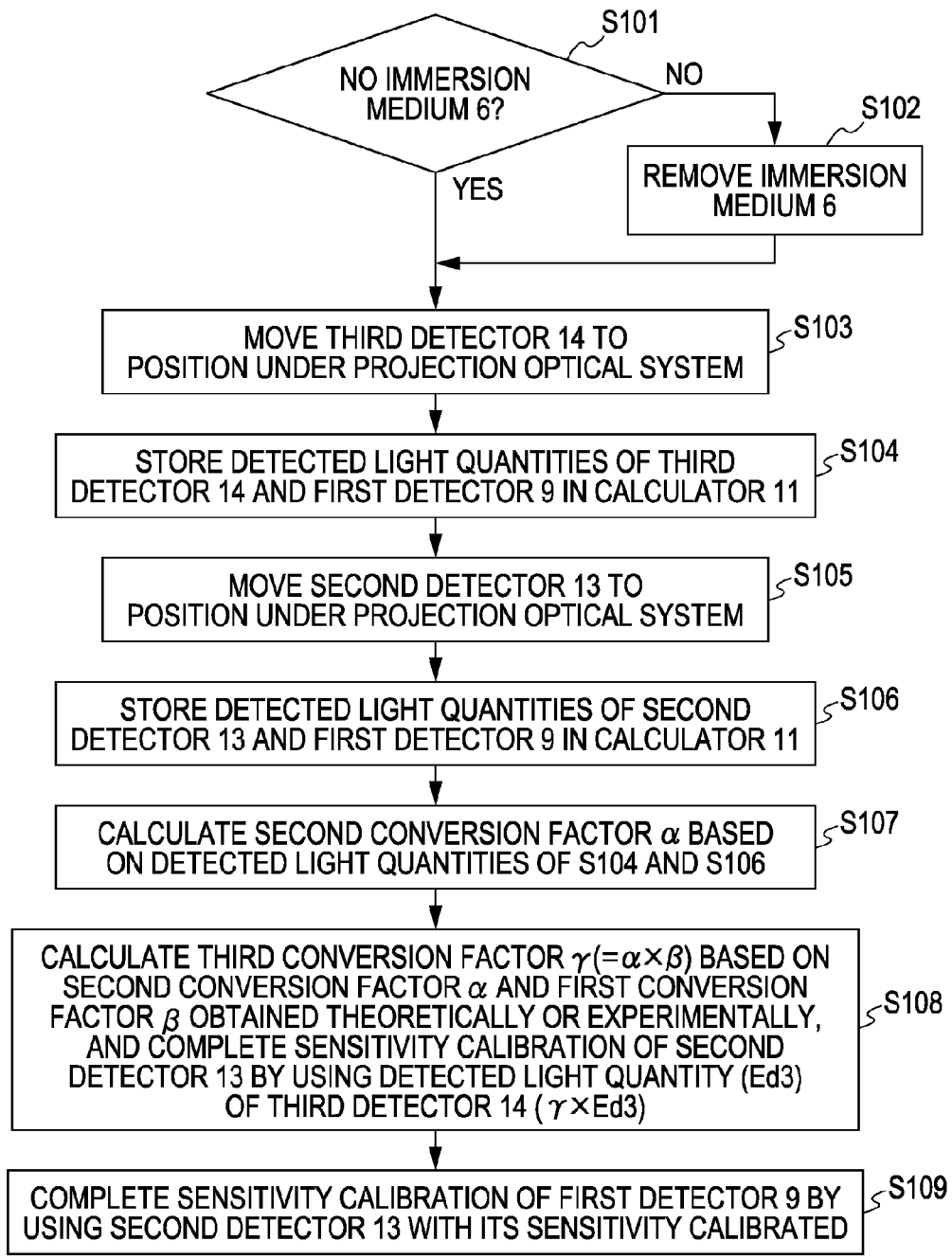

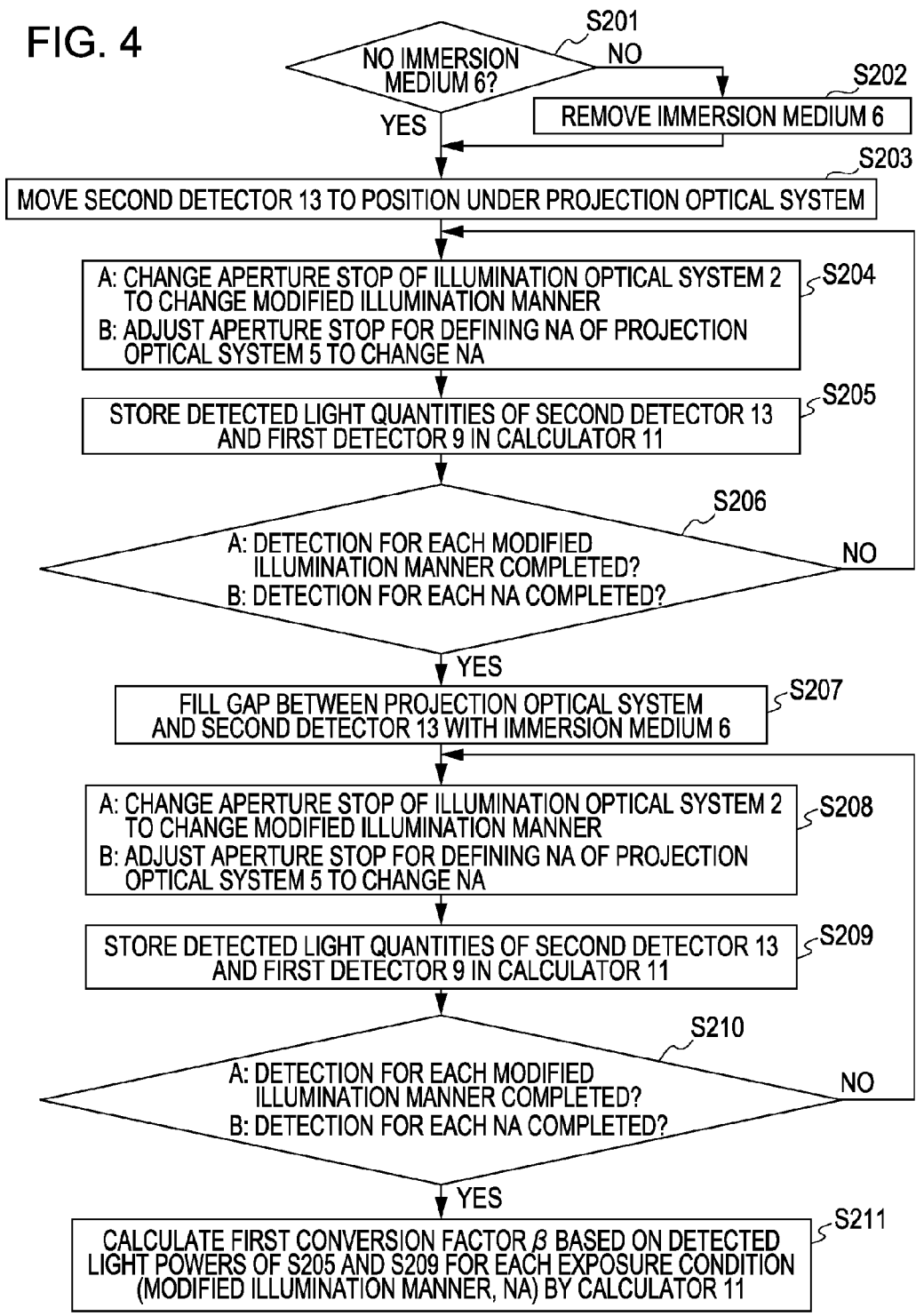

EXPOSURE APPARATUS AND METHOD OF MANUFACTURING DEVICE

BACKGROUND OF THE INVENTION

1. Field of the Invention

The present invention relates to an exposure apparatus and a method of manufacturing devices using the exposure apparatus, the exposure apparatus being used in a photolithography process included in processes of manufacturing devices, e.g., semiconductor devices like integrated circuits (ICs) and large-scale integrated circuits (LSIs); liquid crystal devices (LCDs); image-pickup devices like charge-coupled devices (CCDs); and magnetic heads.

2. Description of the Related Art

Devices, such as for example, semiconductor devices like ICs and LSIs; LCDs; image-pickup devices like CCDs; and magnetic heads are manufactured by photolithography. In the photolithography, a pattern of a reticle (also called an original or a mask) is projected onto a photosensitive substrate (also called a substrate) such as a semiconductor wafer at a predetermined magnification, so that the photosensitive substrate is exposed to light. With an exposure apparatus of a related art, a projection optical system and a wafer have a gap therebetween that is filled with air or gas such as nitrogen. Thus the numerical aperture (NA) of the apparatus is smaller than 1.0.

Generally, a photosensitive material applied on the wafer has a suitable amount of exposure. Due to this, an optical member (for example, a half mirror) is disposed in an illumination optical system of the projection-type exposure apparatus. The optical member splits the exposure light and a light-receiving element (a first detector) such as a photodetector detects a light quantity of the split exposure light. On the basis of the output from the light-receiving element, the amount of exposure is controlled in order to expose the material to the light with the suitable amount of exposure.

In addition, light transmittances of the illumination optical system and the projection optical system may be slightly varied with time. Therefore, the light-receiving element is necessary to be calibrated based on an illuminance at the surface of the wafer. To calibrate the first detector, a light-receiving element (a second detector) such as a photodetector mounted on a wafer stage measures the exposure light transmitted through the illumination optical system and the projection optical system, with respect to each of various exposure conditions at a position near an image plane of the projection optical system.

In recent years, semiconductor devices are becoming miniaturized. Due to this, an excimer laser source, which emits far ultraviolet rays (vacuum ultraviolet rays), is being used as a light source of the projection-type exposure apparatus. However, if the excimer laser light is used as exposure light, it has been revealed that the optical properties of a glass member and a coating film of an optical component and the light-receiving sensitivity of a detection system such as a photodetector are gradually deteriorated. In addition, an incident angle of light relative to the light-receiving element on the wafer stage may be varied depending on the exposure conditions of the wafer, resulting in the sensitivity of the light-receiving element being varied depending on the incident angle.

To solve this, the light-receiving sensitivity of the second detector is calibrated by using an energy monitor (a third detector), which is detachably mounted on the wafer stage, and has a light-receiving sensitivity calibrated in predetermined gas such as air or nitrogen (with a relatively high accuracy as compared with that of the second detector). As described above, the amount of exposure may be controlled highly accurately (see Japanese Patent Laid-Open No. 2000-150334).

In the projection-type exposure apparatus having a numerical aperture that is smaller than 1 (NA<1.0), since a gap between the projection optical system and the wafer is filled with air or nitrogen, the above energy monitor is used for calibrating the light-receiving sensitivity of the light-receiving element. Meanwhile, in an immersion projection-type exposure apparatus that can have a numerical aperture of 1 or greater (NA≧1.0), the gap between the projection optical system and the wafer is filled with liquid (an immersion medium) such as pure water having a refractive index n that is greater than 1.0. Since the energy monitor for calibrating the light-receiving sensitivity presupposes detection of light incident from the gas, it is difficult to calibrate the sensitivity highly accurately upon detection of light incident from liquid.

SUMMARY OF THE INVENTION

The present invention provides calibration for a light-quantity detector (a second detector) disposed on a substrate stage to detect light incident from liquid by using a light-quantity detector (a third detector) which presupposes detection of light incident from gas.

A first aspect of the present invention is an exposure apparatus for exposing a substrate to light via an original, which includes a light source configured to emit light; an illumination optical system configured to illuminate the original with the light; a substrate stage configured to hold the substrate and to be moved; a projection optical system configured to project the light from the original illuminated by the illumination optical system, the projection optical system and the substrate having a first gap therebetween that is filled with liquid, so that the substrate is exposed to light through the liquid, the projection optical system and the original; a first detector configured to detect a light quantity of light emitted from the light source and passing along a light path of the illumination optical system; a second detector disposed on the substrate stage and configured to detect a light quantity of light emitted from the light source and transmitted through the illumination optical system and the projection optical system; and a calculator configured to determine a first conversion factor with respect to each of a plurality of exposure conditions, based on a first light quantity detected by the second detector in a first state where a second gap between the projection optical system and the second detector is filled with gas, a second light quantity detected by the first detector in synchronization with the detection of the first light quantity by the second detector, a third light quantity detected by the second detector in a second state where the second gap is filled with the liquid, and a fourth light quantity detected by the first detector in synchronization with the detection of the third light quantity detected by the second detector, the first conversion factor being used for conversion between a light quantity detected by the second detector in the first state and a light quantity detected by the second detector in the second state.

A second aspect of the present invention is an exposure apparatus for exposing a substrate to light via an original, which includes a light source configured to emit light; an illumination optical system configured to illuminate the original with the light; a substrate stage configured to hold the substrate and to be moved; a projection optical system configured to project the light from the original illuminated by the illumination optical system, the projection optical system and the substrate having a first gap therebetween that is filled with liquid, so that the substrate is exposed to light through the liquid, the projection optical system and the original; a first detector configured to detect a light quantity of light emitted from the light source and passing along a light path of the illumination optical system; a second detector disposed on the substrate stage and configured to detect a light quantity of light emitted from the light source and transmitted through the illumination optical system and the projection optical system; and a storage configured to store a first conversion factor with respect to each of a plurality of exposure conditions, the first conversion factor being used for conversion between a light quantity detected by the second detector in a first state where a second gap between the projection optical system and the second detector is filled with gas, and a light quantity detected by the second detector in a second state where the second gap is filled with the liquid.

A third aspect of the present invention is a method of manufacturing a device, the method includes exposing a substrate to light using an exposure apparatus as defined in the first aspect of the invention; developing the exposed substrate; and processing the developed substrate to manufacture the device.

A fourth aspect of the present invention is a method of manufacturing a device, the method includes exposing a substrate to light using an exposure apparatus as defined in the second aspect of the invention; developing the exposed substrate; and processing the developed substrate to manufacture the device.

Other aspects, features and advantages shall be apparent to those skilled in the art from the description of the various embodiments of the invention which follows. In the description, reference is made to accompanying drawings, which form apart thereof, and which illustrate an example of the invention. Such example, however, is not exhaustive of the various embodiments of the invention, and therefore reference is made to the claims which follow the description for determining the scope of the invention.

BRIEF DESCRIPTION OF THE DRAWINGS

The accompanying drawings, which are incorporated in and constitute a part of the specification, illustrate embodiments of the invention and, together with the description, serve to explain the principles of the invention.

FIG. 3 is a flowchart showing exemplary steps of a method for calibrating sensitivities.

FIG. 4 is a flowchart showing exemplary steps for determining a first conversion factor $\beta$.

DESCRIPTION OF THE EMBODIMENTS

Figure 1:
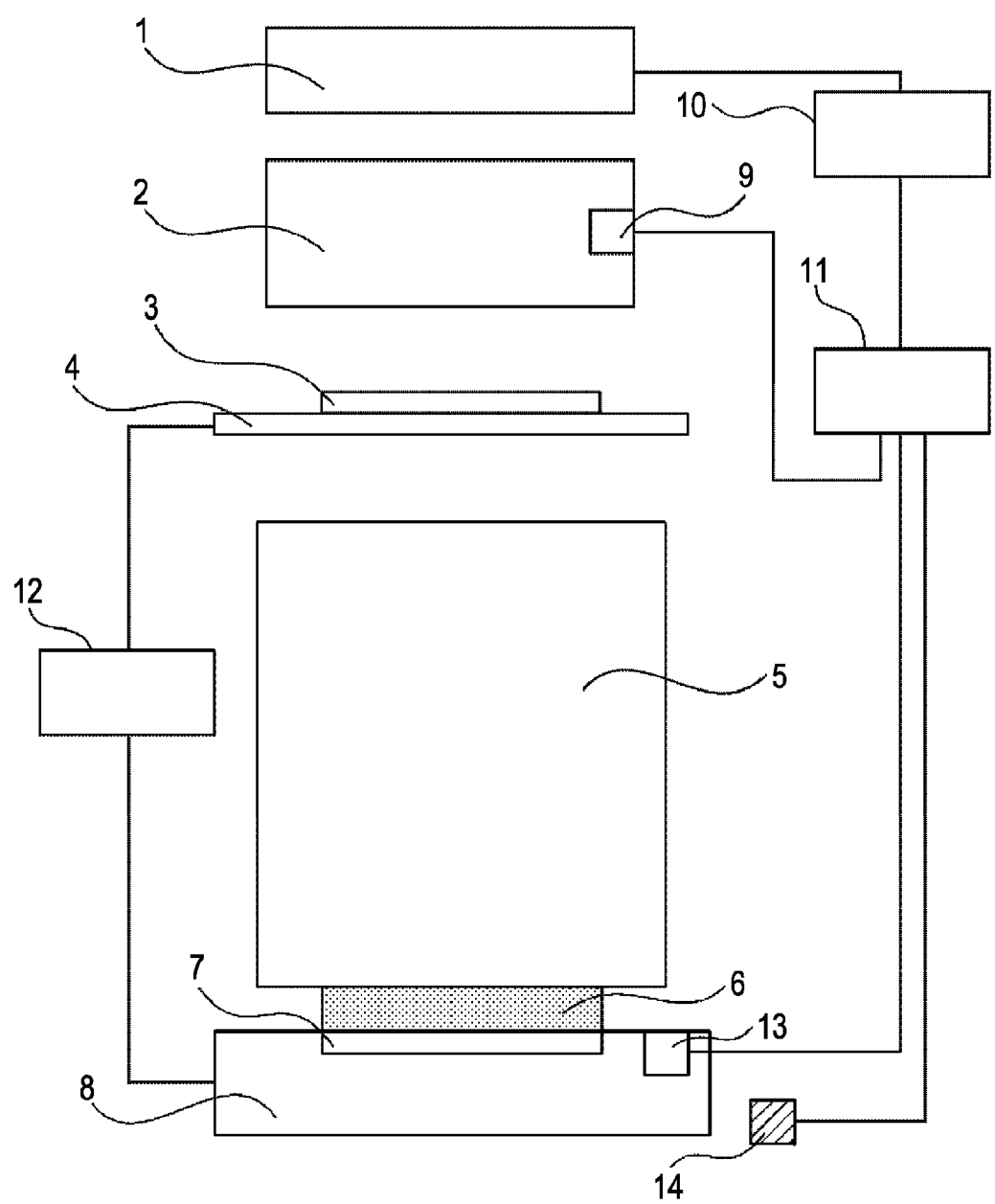
FIG. 1 is an illustration schematically showing an example configuration of an exposure apparatus according to an exemplary embodiment of the present invention.

Exemplary embodiments of an exposure apparatus are described below as exemplary aspects of the present invention with reference to the attached drawings. In the drawings, like members refer like numerals, and redundant descriptions of these members are omitted.

First Exemplary Embodiment

A first embodiment of the present invention is described below with reference to the drawings. FIG. 1 is an illustration schematically showing the configuration of an immersion scanning-and-projection-type exposure apparatus according to the first embodiment of the present invention. The apparatus is used for manufacturing devices, for example, semiconductor devices like ICs and LSIs; LCDs; image-pickup devices like CCDs; and magnetic heads. Note that the embodiment may be applied to an immersion projection-type exposure apparatus which does not perform scanning.

As shown in FIG. 1, a light beam emitted from a light source 1 such as an excimer laser light source enters an illumination optical system 2. The light beam is shaped by the illumination optical system 2, and irradiates a reticle 3 that is sucked to a reticle stage 4. The reticle 3 has a circuit pattern plotted thereon, which is necessary for manufacturing the above-mentioned devices. The beam transmitted through the reticle 3 passes through a projection optical system 5, and forms a miniature image of the circuit pattern on a wafer 7 that is sucked to and retained at a movable wafer stage 8. A gap is defined between the projection optical system 5 and the wafer 7 and is filled with liquid (an immersion medium 6) having a refractive index n that is greater than 1. The above-mentioned technique is called immersion exposure. With this technique, a resolution is improved 1/n times that obtained without using the technique, and a depth of focus is increased n times that obtained without using the technique. A scanning controller 12 controls scanning directions, scanning speeds, and the like, of the reticle stage 4 and the wafer stage 8.

A first detector 9 is a photodetector for continuously monitoring a light quantity for the exposure of the wafer. A part of the beam is split by a half mirror or the like in a light path of the illumination optical system 2. The first detector 9 monitors the split beam. The first detector 9 is disposed at a conjugate position relative to a surface of the wafer 7 to be exposed and a second detector 13 (described below), or at a position near the conjugate position. The light quantity detected by the first detector 9 is fed back to the light source 1 as a light output power. The light source 1 is controlled by a control system including a calculator 11 and a light source controller 10.

The second detector 13 is arranged in the wafer stage 8 to have a height substantially the same as that of the wafer 7. The second detector 13 detects a light quantity and a light quantity distribution in an image plane of the projection optical system 5. The second detector 13 whose sensitivity has been calibrated is generally used for calibrating the sensitivity of the first detector 9. This is because the transmittances of the illumination optical system 2 and the projection optical system 5 may be slightly varied. The first detector 9, which is used during the exposure, is necessary to be calibrated based on the illuminance in the image plane. The second detector 13 may detect a light quantity regardless of the presence of an immersion medium 6 (irrespective of the numerical aperture, NA).

A third detector 14 which is used for calibrating the second detector 13 may be permanently provided at the wafer stage 8 in the same manner as the second detector 13. Alternatively, the third detector 14 may be temporarily mounted at the wafer stage 8, or moved to a position under the projection optical system 5 by a manipulator (not shown), when it is used. FIG. 1 shows a state where the third detector 14 is not permanently provided at the wafer stage 8.

[Exemplary Method for Calibrating Sensitivities of Detectors]

Next, a method for calibrating sensitivities of the first and second detectors 9 and 13 is described. The third detector 14 is a photodetector (an energy monitor) having an absolute sensitivity which has been calibrated. Using the energy monitor, the sensitivities of the first and second detectors 9 and 13 are calibrated. Unfortunately, it is extremely difficult to use the third detector 14 with the immersion medium 6 in order to highly accurately calibrate the first and second detectors 9 and 13. So, the calibrations of the first and second detectors 9 and 13 are performed as follows.

Figure 2A:
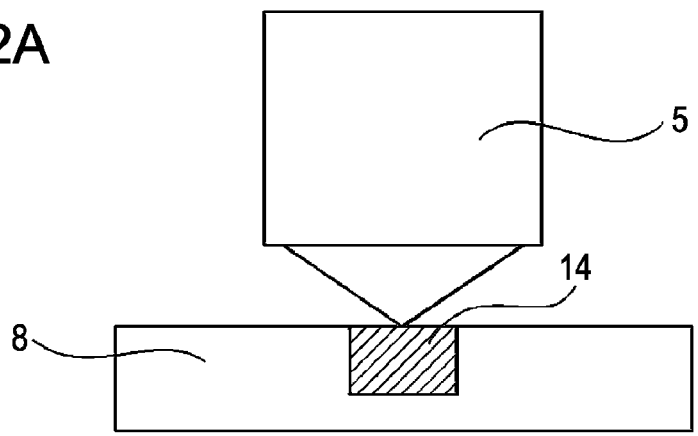
FIGS. 2A to 2C are illustrations showing an example method for calibrating sensitivities of first and second detectors.
Figure 2B:
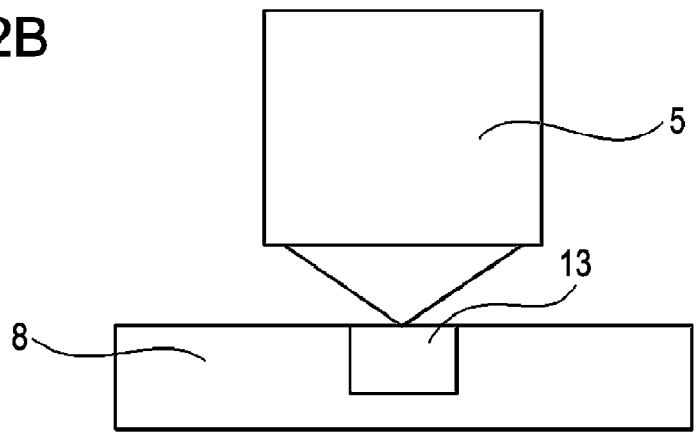
Figure 2C:
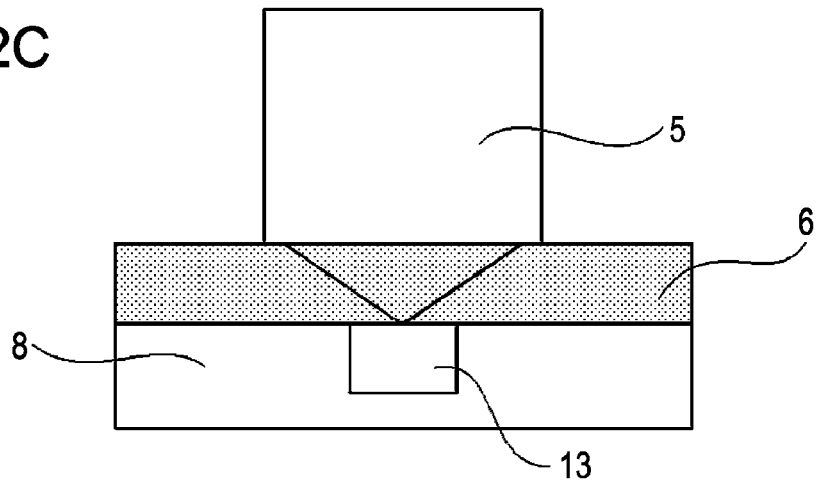

Referring to FIGS. 2A to 2C, the method for calibrating the sensitivities of the first and second detectors 9 and 13 with the immersion medium 6 is described. The sensitivity of the second detector 13 may be calibrated by comparing a detected light quantity of the third detector 14, whose absolute sensitivity is assured, and a detection output of the second detector 13. Note that the method described below presupposes that the third detector 14 may not accurately detect the light quantity with the immersion medium 6.

A conversion factor (a sensitivity calibration factor) (X of the second detector 13 without the immersion medium 6 (also referred to as a second conversion factor) with reference to the third detector 14 is expressed as follows:

$$\alpha = Ed2/Ed3$$

where Exy is a detected light quantity. An index "x" indicates the presence of the immersion medium 6, "d" representing the absence of the immersion medium 6, "w" representing the presence of the immersion medium 6. An index "y" specifies the detector, "1" representing the first detector, "2" representing the second detector, "3" representing the third detector. The above-mentioned light quantity may be a light quantity in the image plane of the projection optical system 5 per unit time. Alternatively, in a case where the light source 1 is a pulsed light source, the light quantity may be a light quantity per pulse, or an accumulated light quantity per predetermined number of pulses.

Although the second and third detectors 13 and 14 may not detect their light quantities at the same time, the first detector 9 may detect its light quantity concurrently with the detection of the second detector 13 or that of the third detector 14. Therefore, the conversion factor (the sensitivity calibration factor) α is derived by using the detected light quantity of the first detector 9.

Herein, "A" represents a light quantity ratio of the detected light quantity of the third detector 14 to the concurrently (synchronously) detected light quantity of the first detector 9 (FIG. 2A).

$$A = Ed3/Ed1$$

"B" represents a light quantity ratio of the detected light quantity of the second detector 13 to the concurrently detected light quantity of the first detector 9 (FIG. 2B). At this time, while leaving the exposure condition in FIG. 2A unchanged, the detector disposed on the wafer stage 8 is changed from the third detector 14 to the second detector 13.

$$B = Ed2/Ed1$$

By using A and B, the conversion factor (the sensitivity calibration factor) α is determined as follows:

$$\alpha = Ed2/Ed3 = (Ed2/Ed1)/(Ed3/Ed1) = B/A$$

With the above expression, the conversion factor (the sensitivity calibration factor) α without the immersion medium 6 is determined. Next, the method for calibrating a sensitivity of the second detector 13 with the immersion medium 6 with respect to the third detector 14 is described.

The immersion medium 6 has an optical property (a refractive index, a transmittance, and the like) that is different from an optical property of air. Due to this, the light quantity detected by the second detector 13 with the immersion medium 6 may be different from that with air (i.e., without the immersion medium 6). Assuming that a rate of change caused by the presence of the immersion medium 6 is represented by a conversion factor (a sensitivity calibration factor) β (also referred to as a first conversion factor), the conversion factor β is expressed as follows:

$$\beta = Ew2/Ed2$$

Described here is an exemplary method for experimentally deriving the conversion factor (the sensitivity calibration factor) β using the immersion projection-type exposure apparatus. By changing an aperture stop (not shown) provided in the illumination optical system 2, an illuminating-light distribution (a modified illumination manner, e.g., a light quantity distribution in a pupil plane of the illumination optical system 2) is changed. The conversion factor (the sensitivity calibration factor) β is determined and stored with respect to each distribution. The first conversion factor (the sensitivity calibration factor) β is stored in a storing unit such as a memory or a storage device provided at the calculator 11.

Alternatively, the conversion factor (the sensitivity calibration factor) β may be theoretically calculated with regard to, for instance, refraction and reflection at each of interfaces in a system constituted by a final lens of the projection optical system 5, liquid (the immersion medium 6) or gas (air, nitrogen. etc.), and the second detector 13; and a transmittance of the immersion medium 6. The calculated first conversion factor β is stored in the above-mentioned storing unit.

A conversion factor (a sensitivity calibration factor) γ of the second detector 13 with the immersion medium 6 (also referred to as a third conversion factor) is a product of the conversion factor (the sensitivity calibration factor) α and the conversion factor (the sensitivity calibration factor) β. In particular, the conversion factor γ is expressed as follows:

$$Ew2/Ed3 = (Ed2/Ed3) \times (Ew2/Ed2) = \alpha \times \beta = \gamma$$

$$Ew2 = Ed3 \times \gamma$$

In the immersion projection-type exposure apparatus, various manners of modified illumination are provided in accordance with patterns to be transferred on the wafer 7. The conversion factor (the sensitivity calibration factor) β may be varied in accordance with the modified illumination manner (the light quantity distribution in the pupil plane of the illumination optical system 2), and hence, a conversion factor (the sensitivity calibration factor) β for the corresponding light quantity distribution is used.

The above described expression shows that the detected light quantity of the second detector 13 with the immersion medium 6 may be provided by multiplying the detected light quantity of the third detector 14 by the conversion factor (the sensitivity calibration factor) γ. In the actual immersion projection-type exposure apparatus, a target amount of exposure is determined, and the value provided by multiplying the detected light quantity of the third detector 14 without the immersion medium 6 by the conversion factor γ is compared with the detected light quantity of the second detector 13 with the immersion medium 6. With this comparison, the conversion factor γ may be updated (FIG. 2C).

[Exemplary Method of Controlling the Amount of Exposure]

Further, a method of controlling the amount of exposure using the first detector 9 is described. The first detector 9 is calibrated by using the second detector 13 of which light-receiving sensitivity has been calibrated based on the conversion factor (the sensitivity calibration factor) γ. In addition, the calibration of the first detector 9 uses the light quantity ratio A of the detected light quantity of the third detector 14 to the concurrently detected light quantity of the first detector 9, and the conversion factor (the sensitivity calibration factor) γ of the second detector 13 with the immersion medium 6.

$$Ew2=Ed1 \times A \times \gamma$$

With the above expression, Ew2 may be determined by detecting the Ed1. Using the detected value of Ed1, the amount of exposure may be controlled.

The derived conversion factor (the sensitivity calibration factor) β may be varied with time, and hence, the conversion factor (the sensitivity calibration factor) β is monitored or updated by using the detected light quantity of the second detector 13 with the immersion medium 6, and without the immersion medium 6 (i.e., with air) in an appropriate timing.

The above conversion factor (the sensitivity calibration factor) β may be experimentally or theoretically determined with respect to each NA, by changing an aperture stop for defining NA (not shown) of the projection optical system 5 to slightly change the NA, for example, by 0.01 at a time. Alternatively, without using the immersion projection-type exposure apparatus, the conversion factor (the sensitivity calibration factor) β may be experimentally determined, e.g., with the use of a device that allows the light from the light source to directly enter the second detector 13.

When the determined conversion factor (the sensitivity calibration factor) β with respect to each NA is used, the conversion factor (the sensitivity calibration factor) β may be changed in accordance with the NAs previously set in the immersion projection-type exposure apparatus.

The above-described method for calibrating the sensitivity of the second detector 13 is applied to a case where the second detector 13 with the immersion medium 6 is calibrated for NAs causing considerable variation in the sensitivity depending on the presence of the immersion medium 6.

Next, a method for calibrating the sensitivity of the second detector 13 is described, the method being applied to a case where the second detector 13 with the immersion medium 6 is calibrated for NAs causing negligible variation in the sensitivity depending on the presence of the immersion medium 6.

The conversion factor (the sensitivity calibration factor) β is dependent on, for instance, a reflectance at each of interfaces in a system constituted by a final surface of the projection optical system 5, the immersion medium 6 or air, and the second detector 13; and a transmittance of the immersion medium 6. If the NAs have the negligible variation in the sensitivity regardless of the presence of the immersion medium 6, the sensitivities of the first detector 9 and the second detector 13 may be calibrated merely by using the conversion factor (the sensitivity calibration factor) α.

FIG. 3 is a flowchart showing exemplary steps of a method for calibrating sensitivities. The presence of the immersion medium 6 on the wafer stage 8 is checked (S101). When the immersion medium 6 is present, the immersion medium 6 is removed from the wafer stage 8 (S102). In this state, the third detector 14 is disposed in a region where the exposure light transmitted through the projection optical system 5 may be incident thereon (S103). In a case where the third detector 14 is not permanently provided on the wafer stage 8, the third detector 14 is mounted on the wafer stage 8 only during detection of the light quantity (S103). The detected light quantity of the third detector 14 and that of the first detector 9 are stored in the calculator 11 (S104). Then, the second and first detectors 13 and 9 detect the light quantities similarly (S105, S106). These detected light quantities are stored in the calculator 11, and the second conversion factor (the sensitivity calibration factor) α is calculated (S107).

Then, the third conversion factor (the sensitivity calibration factor) γ(=α×β) is calculated by using the first conversion factor (the sensitivity calibration factor) β which has been determined theoretically or experimentally, and the second conversion factor (the sensitivity calibration factor) α which has been determined as described above. The sensitivity of the second detector 13 is calibrated by using the light quantity detected by the third detector 14 with the gas (in the gas) (S108). Also, the sensitivity of the first detector 9 is calibrated by using the second detector 13 of which sensitivity has been calibrated (S109).

FIG. 4 is a flowchart showing exemplary steps for determining the first conversion factor (the sensitivity calibration factor) β with the use of the immersion projection-type exposure apparatus. The presence of the immersion medium 6 on the wafer stage 8 is checked (S201). When the immersion medium 6 is present, the immersion medium 6 is removed from the wafer stage 8 (S202). In this state, the second detector 13 is disposed in a region where the exposure light transmitted through the projection optical system 5 may be incident thereon (S203). The aperture stop (not shown) provided in the illumination optical system 2 is changed, so that the modified illumination manner is changed (S204-A). Alternatively, the aperture stop for defining NA (not shown) provided in the projection optical system 5 is adjusted, so as to change the NA by a small step at a time (S204-B). After the setting in S204, the second and first detectors 13 and 9 synchronously detect the light quantities, and these light quantities are stored in the calculator 11 (S205). The detection of the light quantity is repeated until the processing is completed for all modified illumination manners previously set in the immersion projection-type exposure apparatus (S206-A). Alternatively, the detection of the light quantity may be repeated until the processing for all predetermined NAs (S206-B).

Then, the gap between the projection optical system 5 and the second detector 13 is filled with the immersion medium 6 (S207). The procedures similar to those in S204, S205, and S206 are performed, and the second and first detectors 13 and 9 detect the light quantities (S208, S209, and S210). The calculator 11 uses the light quantity ratio of the detected light quantity of the second detector 13 to that of the first detector 9 with respect to each of the case with the immersion medium 6, and the case without the immersion medium 6, so as to calculate the first conversion factor (the sensitivity calibration factor) β with respect to each of a plurality of exposure conditions related to at least one of the modified illumination manners and NAs (S211).

[Application to Device Manufacturing Method]

Figure 5:
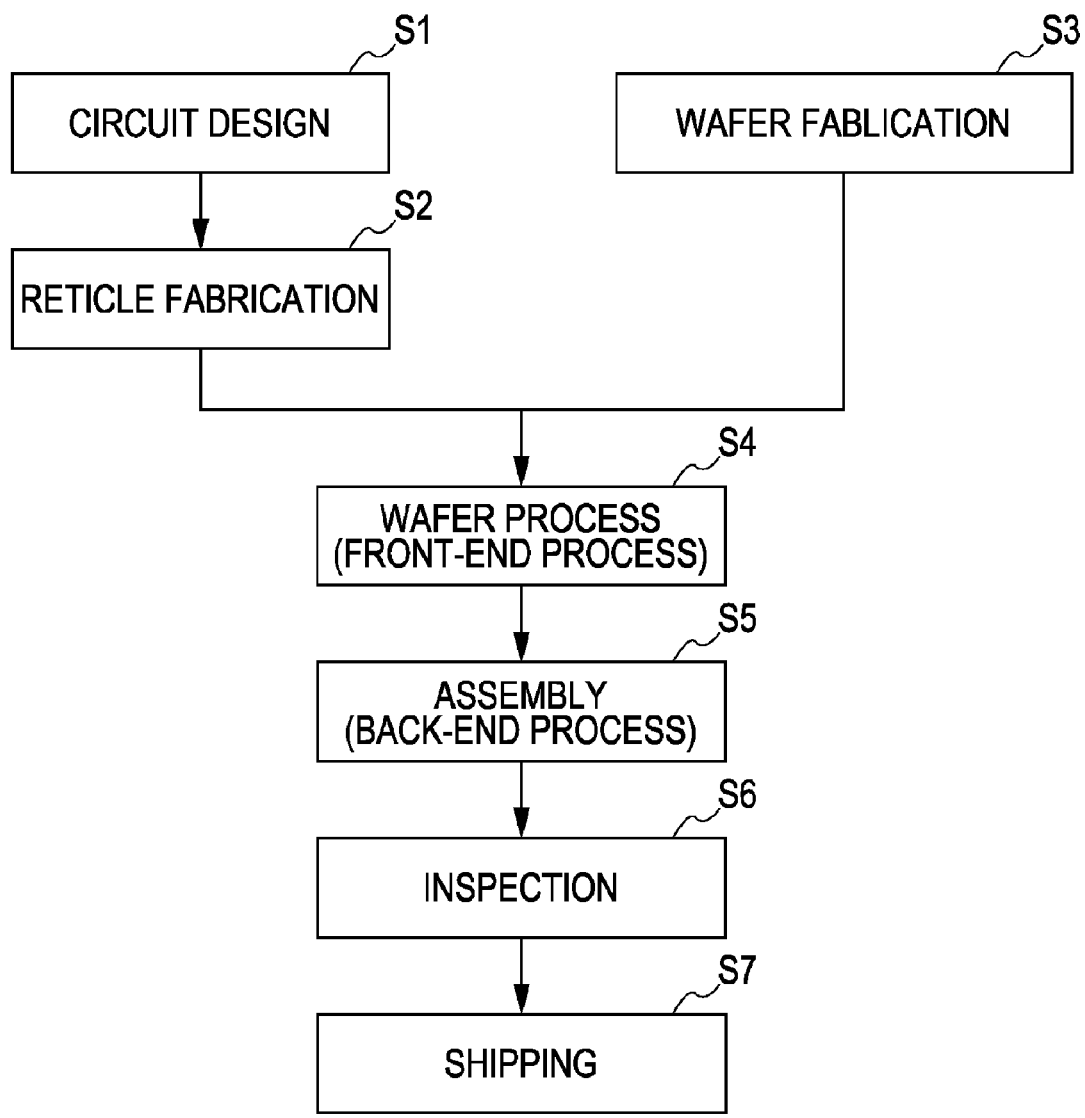
FIG. 5 is a flowchart showing a manufacturing method of devices, for example, semiconductor chips like ICs and LSIs; LCDs; and CCDs.

An embodiment of a method for manufacturing devices with the use of the above-mentioned exposure apparatus is described with reference to FIGS. 5 and 6. FIG. 5 is a flowchart showing manufacturing of devices, for example, semiconductor chips like ICs and LSIs, LCDs, and CCDs. In this embodiment, manufacturing of semiconductor chips is described. In Step S1 (circuit design), a circuit of devices is designed. In Step S2 (reticle fabrication), a reticle is fabricated to have the designed circuit pattern formed thereon. In Step S3 (wafer fabrication), a wafer is formed of a material such as silicon. In Step S4 (wafer process), called a front-end process, actual circuits are formed on the wafer by lithography of the present invention with the reticle and the wafer. In Step S5 (assembly), called a back-end process, semiconductor chips are formed from the wafer fabricated in Step S4. This process includes an assembly process (dicing and bonding), a packaging process (chip sealing), and the like. In Step S6 (inspection), the semiconductor devices manufactured in Step S5 are tested for, e.g., operation and durability thereof. The manufacturing of the semiconductor devices are completed, and then are shipped (in Step S7).

Figure 6:
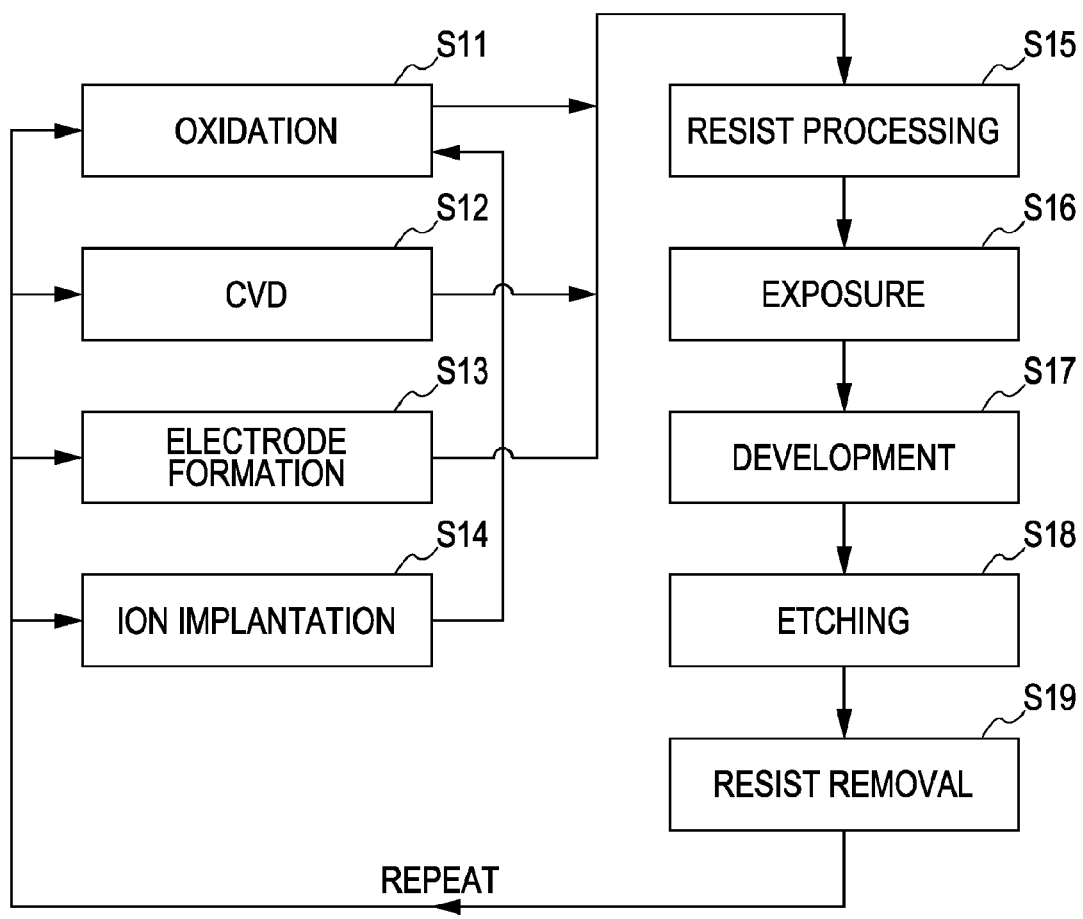
FIG. 6 is a flowchart specifically showing a wafer process corresponding to Step S4 in the flowchart shown in FIG. 5.

FIG. 6 is a flowchart specifically showing the wafer process in Step S4. In Sub-step S11 (oxidation), the surface of the wafer is oxidized. In Sub-step S12 (chemical vapor deposition, CVD), an insulating film is formed on the surface of the wafer. In Sub-step S13 (electrode formation), electrodes are formed on the wafer by deposition. In Sub-step S14 (ion implantation), ions are implanted in the wafer. In Sub-step S15 (resist processing), a photosensitive agent is applied to the wafer. In Sub-step S16 (exposure), the wafer is exposed to light through the circuit pattern of the reticle by the above-mentioned exposure apparatus. In Sub-step S17 (development), the exposed wafer is developed. In Sub-step S18 (etching), parts not occupied by the developed resist image are etched away. In Sub-step S19 (resist removal), the resist, which becomes unnecessary after etching, is removed. By repeating these steps, a multi-layer circuit pattern is formed on the wafer. With the method of manufacturing devices, devices having relatively high quality may be manufactured as compared with the known method. As described above, aspects of the present invention may include the method of manufacturing a device using the exposure apparatus, and the device as a resultant product.

With the above embodiments, for example, a light-quantity detector (a second detector) disposed on a substrate stage to detect light incident from liquid may be calibrated, for example, by using a light-quantity detector (a third detector) which presupposes detection of light incident from gas.

The present invention is not intended to be limited to the above embodiments and various changes and modifications can be made within the spirit and scope of the present invention. Therefore, to apprise the public of the scope of the present invention the following claims are made.

This application claims priority from Japanese Patent Application No. 2006-181895, entitled "EXPOSURE APPARATUS AND METHOD OF MANUFACTURING DEVICE" and filed on Jun. 30, 2006, the entire contents of which are incorporated herein by reference.

What is claimed is:

1. An exposure apparatus for exposing a substrate to light via an original, said apparatus comprising:
    a light source configured to emit light;
    an illumination optical system configured to illuminate the original with the light;
    a substrate stage configured to hold the substrate and to be moved;
    a projection optical system configured to project light from the original illuminated by the illumination optical system, the projection optical system and the substrate having a first gap therebetween that is filled with liquid, so that the substrate is exposed to light through the liquid, the projection optical system and the original;
    a first detector configured to detect a light quantity of light emitted from the light source and passing along a light path of the illumination optical system;
    a second detector disposed on the substrate stage and configured to detect a light quantity of light emitted from the light source and transmitted through the illumination optical system and the projection optical system; and
    a calculator configured to determine a first conversion factor with respect to each of a plurality of exposure conditions, based on a first light quantity detected by the second detector in a first state where a second gap between the projection optical system and the second detector is filled with gas, a second light quantity detected by the first detector in synchronization with the detection of the first light quantity by the second detector, a third light quantity detected by the second detector in a second state where the second gap is filled with the liquid, and a fourth light quantity detected by the first detector in synchronization with the detection of the third light quantity by the second detector, the first conversion factor being used for conversion between a light quantity detected by the second detector in the first state and a light quantity detected by the second detector in the second state.

2. An apparatus according to claim 1, wherein the calculator is configured to determine a second conversion factor, based on a fifth light quantity of light, emitted from the light source and transmitted through the illumination optical system and the projection optical system, detected by using a third detector configured to have an accuracy higher than that of the second detector in respect to detection in the gas, in a third state where a third gap between the projection optical system and the third detector is filled with the gas, a sixth light quantity detected by the first detector in synchronization with the detection of the fifth light quantity by the third detector, a seventh light quantity detected by the second detector in the first state, and an eighth light quantity detected by the first detector in synchronization with the detection of the seventh light quantity detected by the second detector, the second conversion factor being used for conversion between a light quantity detected by the second detector in the first state and a light quantity detected by the third detector in the third state.

3. An apparatus according to claim 2, wherein the calculator is configured to determine a third conversion factor being used for conversion between a light quantity detected by the second detector in the second state and a light quantity detected by the third detector in the third state, based on the second conversion factor, and the first conversion factor corresponding to an exposure condition, under which the second conversion factor is determined, of the plurality of exposure conditions.

4. An apparatus according to claim 1, wherein the plurality of exposure conditions are different from each other in at least one of a light quantity distribution in a pupil plane of the illumination optical system, and a numerical aperture of the projection optical system.

5. An apparatus according to claim 1, further comprising a storage configured to store the first conversion factor determined by the calculator with respect to each of the plurality of exposure conditions.

6. A method of manufacturing a device, the method comprising steps of:
    exposing a substrate to light using an exposure apparatus as defined in claim 1;
    developing the exposed substrate; and
    processing the developed substrate to manufacture the device.

7. An exposure apparatus for exposing a substrate to light via an original, said apparatus comprising:
    a light source configured to emit light;
    an illumination optical system configured to illuminate the original with the light;

a substrate stage configured to hold the substrate and to be moved;

a projection optical system configured to project light from the original illuminated by the illumination optical system, the projection optical system and the substrate having a first gap therebetween that is filled with liquid, so that the substrate is exposed to light through the liquid, the projection optical system and the original;

a first detector configured to detect a light quantity of light emitted from the light source and passing along in a light path of the illumination optical system;

a second detector disposed on the substrate stage and configured to detect a light quantity of light emitted from the light source and transmitted through the illumination optical system and the projection optical system; and a storage configured to store a first conversion factor with respect to each of a plurality of exposure conditions, the first conversion factor being used for conversion between a light quantity detected by the second detector in a first state where a second gap between the projection optical system and the second detector is filled with gas, and a light quantity detected by the second detector in a second state where the second gap is filled with the liquid.

8. An apparatus according to claim 7, further comprising:

a calculator configured to determine a second conversion factor, based on a fifth light quantity of light, emitted from the light source and transmitted through the illumination optical system and the projection optical system, detected by using a third detector configured to have an accuracy higher than that of the second detector in respect to detection in the gas, in a third state where a third gap between the projection optical system and the third detector is filled with the gas, a sixth light quantity detected by the first detector in synchronization with the detection of the fifth light quantity by the third detector, a seventh light quantity detected by the second detector in the first state, and an eighth light quantity detected by the first detector in synchronization with the detection of the seventh light quantity detected by the second detector, the second conversion factor being used for conversion between a light quantity detected by the second detector in the first state and a light quantity detected by the third detector in the third state.

9. An apparatus according to claim 8, wherein the calculator is configured to determine a third conversion factor being used for conversion between a light quantity detected by the second detector in the second state and a light quantity detected by the third detector in the third state, based on the second conversion factor, and the first conversion factor corresponding to an exposure condition, under which the second conversion factor is determined, of the plurality of exposure conditions.

10. An apparatus according to claim 7, wherein the plurality of exposure conditions are different from each other in at least one of a light quantity distribution in a pupil plane of the illumination optical system, and a numerical aperture of the projection optical system.

11. A method of manufacturing a device, the method comprising steps of:

exposing a substrate to light using an exposure apparatus as defined in claim 7;

developing the exposed substrate; and processing the developed substrate to manufacture the device.

* * * * *